United States Patent [19]

Lisle et al.

[11] Patent Number: 4,843,389

[45] Date of Patent: Jun. 27, 1989

[54] TEXT COMPRESSION AND EXPANSION METHOD AND APPARATUS

[75] Inventors: Ronald J. Lisle, Austin, Tex.; Eual A. Moss, Raleigh; John H. Ryder, Durham, both of N.C.

[73] Assignee: International Business Machines Corp., Armonk, N.Y.

[21] Appl. No.: 937,799

[22] Filed: Dec. 4, 1986

[51] Int. Cl.[4] .................................................. H03M 7/42
[52] U.S. Cl. .................................... 341/106; 341/90; 364/200; 364/900
[58] Field of Search ................ 340/347 DD; 364/200, 364/300, 900; 341/86, 90, 106

[56] References Cited

U.S. PATENT DOCUMENTS

| 3,348,205 | 10/1967 | Lee | 340/347 DD X |
| 4,295,124 | 10/1981 | Roybal | 341/86 |
| 4,386,416 | 5/1983 | Giltner et al. | 364/900 |
| 4,545,032 | 10/1985 | Mak | 341/90 |
| 4,597,057 | 6/1986 | Snow | 341/90 |
| 4,646,061 | 2/1987 | Bledsoe | 340/347 DD |

OTHER PUBLICATIONS

Rubin, Experiments in Text File Compression, Communications of the ACM, 11/1976, vol. 19, No. 11, pp. 617-623.
Weiss et al, Journal of Library Automation, vol. 11, No. 2, 6/1978, pp. 97-105.
Datran, Inc. Publication, Modem Accelerator Multifunction Board, 1985, 2 pages.

*Primary Examiner*—William M. Shoop, Jr.
*Assistant Examiner*—Brian Young
*Attorney, Agent, or Firm*—Edward H. Duffield

[57] ABSTRACT

A text compression method and apparatus are disclosed that enable overall compression ratios of more than six or eight to one for normal language text. Plural multiple-word dictionaries that are specialized for the particular field of use are employed together with a header transmission format that identifies which dictionaries are to be used. In addition, entries in these dictionaries are categorized by a weighted frequency of use ranking in which the product of the word length in characters and the frequency of occurrence of that word in the text is taken as the weighted figure of merit for ranking words to be placed in the individual dictionaries.

3 Claims, 12 Drawing Sheets

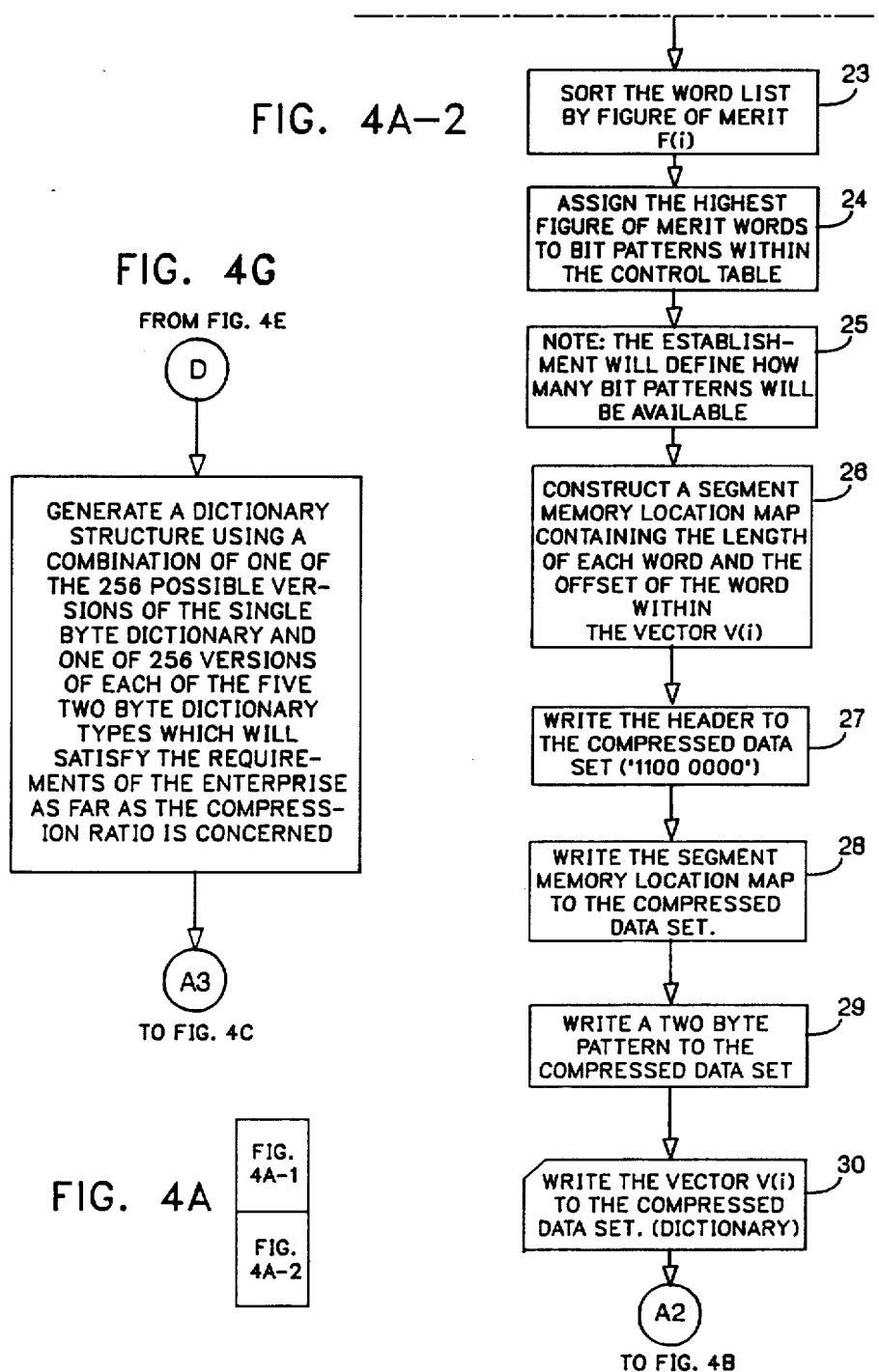

FIG. 5

EXAMPLE COMPRESSED TEXT STRINGS (A) | SINGLE BYTE COMPRESSED WORD | ESCAPE BIT PATTERN | FIRST CHARACTER OF WORD NOT IN ANY DICTIONARY | LAST CHARACTER OF WORD NOT IN ANY DICTIONARY | ESCAPE BIT PATTERN |

(B) | SINGLE BYTE COMPRESSED WORD | SEGEMENT NUMBER OF A THREE BYTE DICTIONARY | RELATIVE POSITION OF WORD WITHIN TWO BYTE DICTIONARY | SINGLE BYTE COMPRESSED WORD | MULTIPLE SPACE DETECTION BIT POSITION |

(C) | NUMBER OF MULTIPLE SPACES DETECTED | SEGEMENT NUMBER OF A TWO BYTE DICTIONARY | RELATIVE POSITION OF WORD WITHIN THREE BYTE DICTIONARY |

(D) | END OF TEXT BIT PATTERN |

TEXT COMPRESSION AND EXPANSION METHOD AND APPARATUS

FIELD OF THE INVENTION

This invention relates to text compression and expansion methods and devices in general and specifically to the class of digital to digital converters such as those found in the patent classification Class 340, Sub. 347.

PRIOR ART

A wide variety of prior patents and published papers exist in this field. U.S. Pat. No. 4,545,032, for example teaches one of the basic techniques of a dictionary or tabular conversion in which numerical codes for the basic English language vocabulary are utilized. However, the words are broken up into prefixes, suffixes and stems and it does not appear that weighted ranking of the dictionary entries or tabular entries was considered or applied. Also it does not appear that the concept of being able to switch between different tables or dictionaries based upon the field of usage was considered at all.

U.S. Pat. No. 4,597,057 has another typical example of a compression technique in which standard ASCII coded text may be divided into alpha, numeric and punctuation elements as "words" with the "words" being divided into prefixes, suffixes and stems. The prefixes, suffixes and stems utilize numeric encoding in a fashion similar to the aforementioned U.S. Pat. No. 4,545,032.

U.S. Pat. No. 4,295,124 is an earlier example of a dictionary or tabular look-up type of conversion for applying numeric codes to English text characters. The input ASCII encoded textual words are utilized to generate a second representative code by hashing. This code can be utilized as the memory address for comparison against a prearranged dictionary or memory of textual words. When a match is found, the hashing address is sent as an identifier. If a match is not found, an auxiliary dictionary is built up but the word is transmitted uncompressed the first time it is encountered. The next time the same word is encountered, both dictionaries are checked and if the word is found in the second built-up dictionary, its hashing address is sent. While this description appears to be an efficient and useful technique, it does not employ the flexibility of numerous dictionaries that can be carefully selected for the field usage of the text and does not appear to employ a weighted figure of merit for assigning entries into the dictionaries.

U.S. Pat. No. 4,386,416 is similar to the aforementioned U.S. Pat. No. 4,295,124 but utilizes an escape code to indicate whether a code from a memory library address or a differently encoded representation of words not found in the library are utilized. Again, no weighted figure of merit for the dictionary entries appears to have been employed nor is the technique of utilizing a preamble or header to identify the particular subset of dictionaries employed in a given compression of text indicated.

The basic technique of encoding utilizing dictionaries for prefixes, suffixes and stems of words is found in numerous references such as the Proceedings of the IEEE, Vol. 55, No. 3, March, 1967, pages 390-396 in an article by H. E. White entitled, "Printed English Compression by Dictionary Encoding." A compression of only about two to one was found in this paper and it is found to be generally similar to those of the first two mentioned patents above.

The use of multiple tables or dictionaries itself is not totally new to the art. An example may be found in the article by J. Pike, "Text Compression Using A Four-Bit Coding Scheme," appearing in the Computer Journal, Vol. 24, No. 4, 1981, pages 324-330. However, the article fails to recognize that a truly flexible system utilizing a variety of dictionaries and a header or preamble in the compressed text to indicate which selection of dictionaries has been made for the given compression could be utilized. Further, the use of weighted entries for selection of the words to comprise the given dictionaries to nowhere described.

An early paper entitled, "Experiments in Text File Compression," by Rubin appearing in the Communications of the ACM, November, 1976, Vol. 19, No. 11, pages 617-623 treates the subject of weighted frequency of occurrence as a figure of merit for ranking words for dictionary construction for text compression. However, based on the experiments conducted by that author, it was concluded that frequency was the best method for maximizing the savings in choosing input groups, i.e., dictionary entries. This failed to take account of the possibility that different rankings would occur in different dictionaries for the same word and that switching between dictionaries that are better suited for a given text is a possibility at all.

An early paper showing the use of escape characters to effectively extend the size of the dictionary or change from the use of one dictionary to another is in the article entitled, "A New Technique for Compression and Data Storage," by Hahn appearing in the Communications of the ACM, August, 1974, Vol. 17, No. 8, pages 434-436. This article also shows the dynamic method of adding new or unknown symbols or words encountered to the dictionary. However, character groups rather than words are utilized and the author notes that the experiments with the technique showed somewhat lesser degree of compression than word codes for English text compression.

An overview paper dealing with several methods but not describing the use of the weighted word frequency technique nor the use of a preamble or header to indicate the use of multiple dictionaries is found in the IEEE Transactions on Software Engineering, Vol. SE6, No. 4, July, 1980, pages 340-347 in an article entitled, "Overhead Storage Considerations and a Multi-Linear Method for Data File Compression," by Young et al. A similar overview is found in the Computer publication of April, 1981, pages 71-75 in an article entitled, "An Overview of Data Compression Techniques," by Reghbati.

Finally, an article by Weiss et al appearing in the Journal of Library Automation, Vol. 11, No. 2, June, 1978, pages 97-105 presents a limited dictionary scheme utilizing an escape code or dictionary indication code to show to the decompression system when a compressed word has been taken from a dictionary file and to indicate, by its absence, that the word is not compressed and is transmitted to ordinary ASCII or EBCDIC characters. Pointers for escape characters identify themselves as pointers and indicate the dictionary entry for the word that they represent. Source files of EBCDIC or ASCII encoded text are read one word at a time and the words are compared against the dictionary. If the word is not found, the word and any trailing delimiter such as punctuation marks or spaces are written unchanged into the compressed file. If the word is found, a pointer indicating that the word was found in the dictionary and pointing to the dictionary location is written to the compressed file. This is essentially the same technique as the aforementioned U.S. Pat. No. 4,386,416 which differs only in the terminology employed to describe this method. The use of multiple dictionaries and a weighted frequency of occurrence method of assigning entries are not described in this article.

From all of the foregoing, it is apparent that while much work has been done on text compression methods, techniques and systems, the investigators to date have avoided the use of mutiple extensive dictionaries. This may have been due to the complexity of handling the data storage requirements and in switching among dictionaries. Additionally, early studies of the weighted frequency of occurrence method of assigning entries to the dictionaries have found, contrary to the findings of the present invention, that the weighted frequency of use for dictionary entries is not as beneficial as pure frequency of occurrence. The best known compression ratios from the above-noted prior art appear to be in the range of four or five to one, but we have unexpectedly discovered that by the use of multiple dictionaries with their entries being selected on the basis of weighted frequency of use, compression ratios on the order of more than six to one to as high as eight to one are routinely achievable.

OBJECTS OF THE INVENTION

In view of the shortcomings of the above-noted prior art, it is an object of this invention to provide an improved text compression and decompression technique of the dictionary look-up type in which the dictionaries themselves have their entries arranged by a weighted frequency of use for the words encountered.

Yet another subject of this invention is to provide an improved text compression and expansion technique in which multiple dictionaries are employed according to the specific field of use of the text being compressed and in which a preamble or header is utilized in the compression for indicating which selection of dictionaries has been made for compression.

These and still other objects of the invention not specifically enumerated are met in a preferred embodiment of the invention as will be further described with reference to a preferred embodiment as depicted in the drawings herein.

BRIEF DESCRIPTION OF THE DRAWINGS

FIGS. 4A-1, 4A-2, 4A, 4B, 4C, 4D, 4E, and 4G illustrate a fully augmented compression routine flow chart as is implemented in the microprocessor of FIG. 1 for compression of text.

FIG. 5 illustrates a typical example of the format of a compressed text string utilizing the techniques of the present invention.

BRIEF SUMMARY OF THE INVENTION

Figure 1:
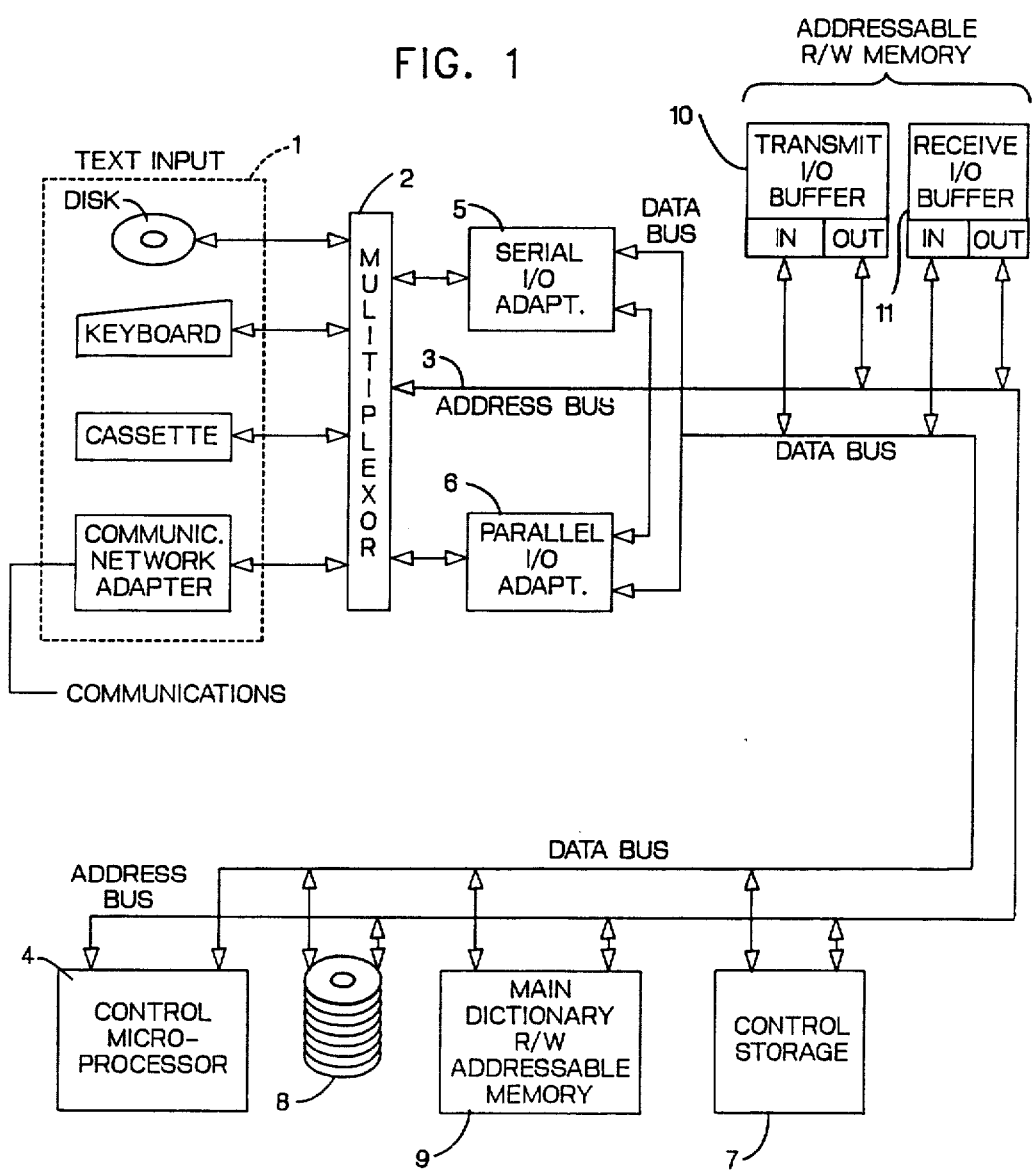
FIG. 1 is a schematic illustration of a text compression and decompression system in accordance with the invention.

In the present invention, the foregoing objects are met by providing a plurality of language use specific dictionaries whose entries of words are ranked in a weighted frequency of usage ranking based on statistical studies of the areas of use employed. For example, words such as "docket" or "versus" or "case" will appear much more frequently in legal texts than in normal English usage. Similar professional jargon is found for other fields as well, engineering, business, accounting, medicine, agriculture, petro-chemicals, etc., etc., ad infinitum being possibilities. In the present invention, the user of a text compression and decompression system builds up dictionaries that are custom-tailored to the field of use. This is done by utilizing a scanning and analysis technique that incorporates counting both the number of characters in each unique word and the number of occurrences of the word within the general usage over a sample of texts from the user's environment. Multiple such dictionaries can be constructed and applied to maximum beneficial effect to achieve a high degree of compression for an individual user. A preamble or header is constructed in compressed text to indicated the user's selection of the appropriate dictionaries actually employed in doing the compression for a given text source input. The header is employed to instruct the receiver as to which dictionaries and control tables are to be loaded into memory for use in the decompression routine. Simple, single-byte entries in a control table can be employed for indicating the source in compressed text of each individual word or group of words when the words are found outside of a single byte control table itself. A hierarchy of dictionaries ranging from the single byte control table which contains the control codes and dictionary segment indicators as well as a list of somewhere between 80 and 224 frequently encountered words is the highest priority dictionary for searching for compression or expansion. Two and three byte encoded dictionary entries where the first byte indicates a specific dictionary segment in memory and the second byte indicates an offset or memory address position within the segment are also employed. The system may be implemented on a typical microprocessor computer system that has a bulk storage such as disk or cassette and a normal size working read/write memory into which the various control tables and dictionaries can be assembled for use by reading them from a bulk storage mechanism. Typical flow charts for compression and decompression are included and will be described in greater detail.

DETAILED SPECIFICATION

The compression technique of the present invention allows more data to be stored on a given medium and/or it allows more data to be sent in reduced time over a transmission link between any two locations. The normal compression ratio achieved may be as high as 6 to 8 although, when the effect of adding in the transmission header and dictionary indicators is taken into account, the overall compression ratio falls slightly. In a data processing organization, the delay for hard copy documentation is excessively costly. In many such locations, the need for sharing large quantities of information between additional remote locations results in investment in extensive communications networks. The growth of the networks and the major expense to the organizations employed is a factor dictating the necessity of developing efficient text compression and expansion methods and systems. In addition, visual displays and desk top computers have proliferated and a major part of information processed is textual data that is presented on the screen. Therefore, any effective compression technique that will minimize the amount of storage space and/or transmission medium employed will be of major benefit. Numerous compression techniques have been developed as alluded to earlier under the prior art section of this application and most of these techniques result in an overall compression factor in the range of 1.5 or 2 to 1.

The present text compression technique in the invention at hand is one that addresses the degree of repetitive occurrence and the length of certain words in the basic language of the persons generating and utilizing the text. Many options are provided. The options may be tailored to specific environments and to specific documents themselves by selecting the basic dictionary type employed. Either a predefined existing dictionary or dictionaries that have been generated especially for text compression or dictionaries that are created on-line for the individual text itself may be utilized in combination or separately. The dictionaries are arranged on byte wide boundaries of addresses to simplify processing. Those dictionaries that have a single byte address utilize the highest degree of compression but are also of limited length since only 256 different entries can exist for a given 8-bit byte. Two byte compression word dictionaries enable a much greater range of words to be defined, i.e., 65,536 words or two byte entry addresses are possible. Extension to a three byte address makes possible a maximum of 16,777,216 entries which is far in excess of all words encountered in the English language. Dictionaries for graphics displays and audio playback are also permitted since these are merely digital representations of specific signals for output by graphic or audio devices. Obviously, the technique is not limited to English language. Virtually any character-spelled language may be similarly treated by our methods. English is only used for convenience herein in explaining our invention.

The basic approach of the preferred text compression technique is to substitute a 1, 2 or 3 byte address pattern for actual English words found in a given document. The word "document" as used herein is used to define encoded textual data, graphics data or audio data that is created by or utilized by human operators. Key stroke entries may be recorded on a disk, a tape or the like or stored in memory as a source text of the typical English language. Such source text is actually a series of ASCII coded alphanumeric characters, space characters, punctuation marks, control characters, such as capitalization, case shift, line feed and the like, etc. The assignment of the dictionary word entries is based on their relative weighted merit according to their frequency of use and length. The relative weighted merit is based upon the length of each word and the frequency of its occurrence in a specific document or within a specific environment such as law, engineering, medicine or the like. The limitation of the compressed bit patterns to lengths of 1, 2 or 3 bytes which would be 8, 16 or 24 bits, makes implementation of these techniques on byte oriented computers available today highly feasible.

The basic compression technique will utilize at least one and usually several dictionaries. The most basic and compact dictionary is the 256 entry single byte compression table. This table is generated to contain the control patterns necessary to decode indications telling which dictionaries are being employed in a given compression, the most frequently occurring words in the environment of concern, and any necessary control patterns or signals. Single byte address compression is obviously limited for 8 bit bytes to 256 unique binary patterns. Some of these patterns must be reserved for control sequences and for definitions of the individual dictionary segments being employed in a given compression. The single byte compression table or memory will thus be limited to words which have the highest relative merit and which will fit into the 256 possible patterns minus the number of reserved control patterns. This approach may be used for small documents to great advantage. Small documents are those consisting of only 2 to 3 pages, for example.

If a 2 byte compression dictionary or memory is constructed, it will have a possible maximum of 65,536 entries defined. However, one bit must be reserved to indicate that a two-byte pattern is used, so only 32,768 actual dictionary entries are then possible. Viewed differently, 128 segments of 256 words each may be encoded. In many cases, however, the normal vocabulary in constant use for a specific group such as an accountant's or lawyer's office would be only a few thousand words. If the maximum basic dictionary size of 2 bytes or 65,536 possible entries is selected, at least one bit of the first byte would have to be used to identify the fact that a 2 byte encoding pattern is employed because the decompression routine must know how to group the compressed bytes either singly in 2's or in 3's. Thus, instead of 256 possibilities for the first byte, only 128 patterns are left in the first byte alone and a total of 128 sections of 256 patterns each can actually be selected. One hundred twenty-eight 8 bit patterns must be reserved in the control table to indicate which 256 word segment of the 2 byte dictionary is being employed in each instance. Thus, the first "byte" of the 2 byte address is taken from the control table. This will leave, of the original 256 possible patterns in the single byte control table, 128 patterns that may be employed for control sequences, high relative merit words and the like.

If the basic dictionary size is arbitrarily limited from 32,768 to only one-half that number, i.e., 16,384, then 192 bit patterns will be left available in the single byte table for the control sequences and high relative merit words. If a basic 2 byte dictionary size of only 8,192 patterns is selected, a likely and useful choice, then 224 bit patterns will be left over in the single byte table for control sequences, encoding format indicators and high relative merit words.

In general, the number of bit patterns left in a single byte control table out of the 256 original possible ones will be 256 less the basic dictionary size selected for containing the words in the 2 or 3 byte dictionaries that may be employed, divided by 256. That is, the manner of encoding the data in this invention is by direct table entries but indications must be placed in the compressed text to indicate which table is employed. A basic control table of 256 possible entries must have reserved in it pattern for ever 256 entries in the 2 byte dictionaries that may be employed and one pattern for every 65,536 entries in each three byte dictionaries employed. These are termed "dictionary segments" and a unique identifying pattern is reserved in the control table for each segment of each dictionary employed in each text compression example. Of course, the control table could be expanded to be a 2 byte table but this would have a negative effect upon the overall compression ratio. In most cases, higher compression factors can be achieved by selecting a smaller number of entries for the basic word dictionary size. Many locations or organizations have an actual working vocabulary of only a few thousand words. Therefore, the compression factor can be optimized by selecting a basic working vocabulary dictionary in the area of 8,192 words ($\frac{1}{4}$ of the possible size of a 2 byte pattern dictionary). This will require only 32 reserved bit patterns for the single byte control table since 32 times 256 equals 8,192. In the example just given, 224 possible entries would remain out of the 256 available originally in a single byte control table. The 224 entries could be advantageously assigned to high frequency of use words, control characters and alphanumeric characters if desired.

This brief description of the flexibility inherent in the present invention leads to a consideration of how the complex set of possible dictionaries selected for a given text compression can be communicated to the decompression or expansion user. This is accomplished in the present invention by utilizing a preamble or a header to the compressed text.

Figure 6A:
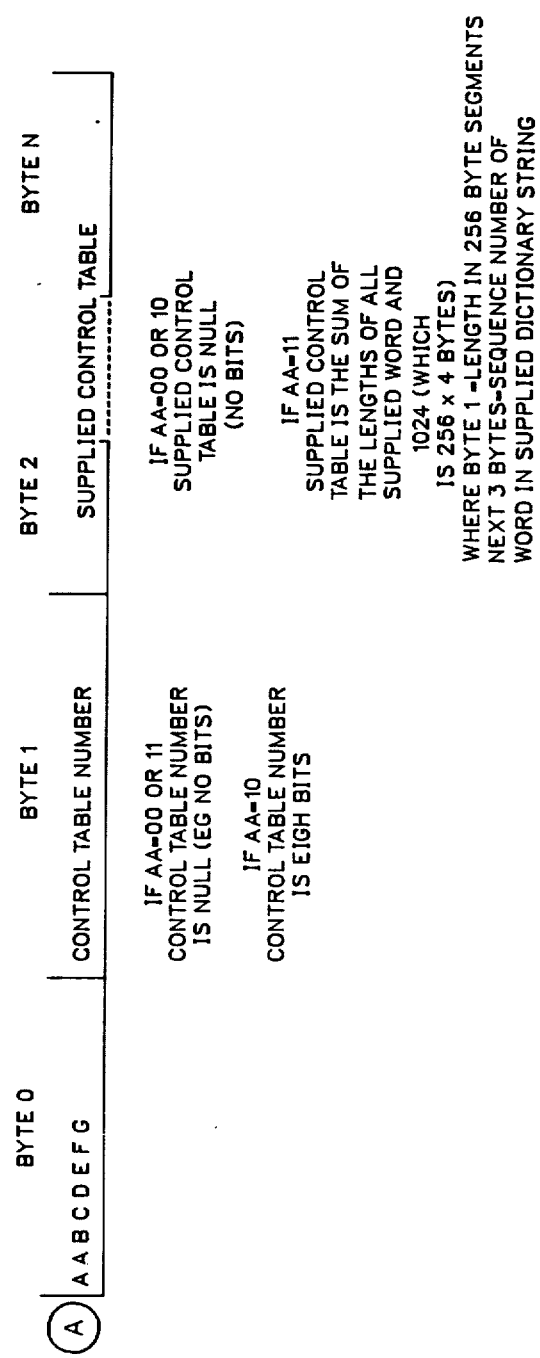
FIGS. 6A and 6B are schematic drawings illustrating the assignment of the bit locations in the header or preamble section of a compressed data record which enables interpretation by the receiver or text expansion system for selecting the appropriate dictionaries and control tables for expansion of the compressed text.
Figure 6B:
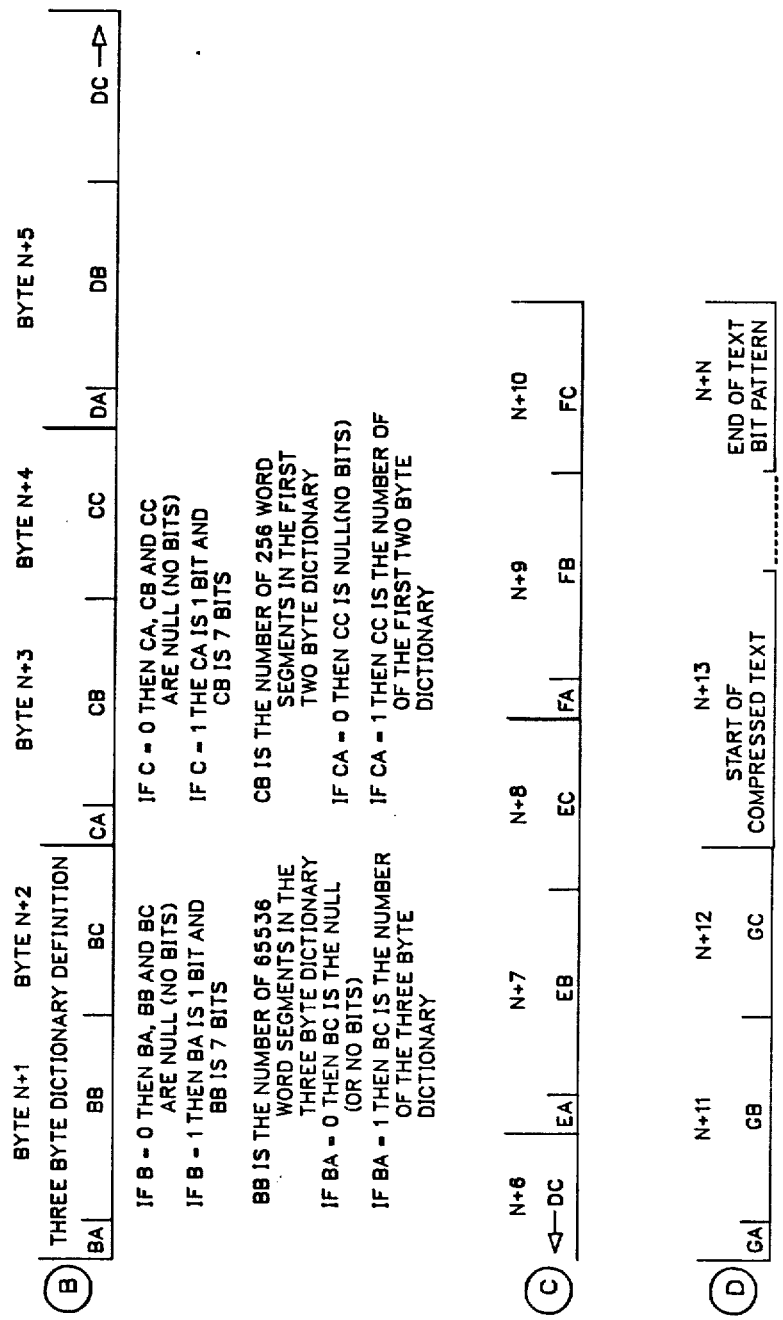

FIG. 6 illustrates schematically the header encoding format which is employed in the present invention. Line A illustrates the start of the header with byte 0 being identified. Bits AA are utilized in the present invention to define the type of single byte compression table that is being used. Two types are possible. Either an existing default value single byte compression table is employed which consists of a prearranged set of assignments for the 256 possible patterns in a single byte table or an alternative existing single byte compression table is to be used and may be found on a predefined external storage medium. Alternatively, a single byte compression table will actually be provided within the compressed text byte string or a dictionary of two or three byte address size could be transmitted. These four possible alternatives are encoded by setting the value of bits AA as follows: if bits AA are 00, a default single byte compression table is used in the remainder of the text compression string which follows the header until a new header appears. If the bit values for AA are 01, a reserved unassigned alternative is employed. This pattern could be used to indicate that the dictionary to be used will be transmitted in the compressed text, Bits 10 for AA define an existing single byte compression table is to be used which should be found by the user on the predefined external storage medium, such disk or tape. An example would be that a single byte compression table which has been optimized for cancer specialists in the medical field, for example, is to be employed for a given text compression. The final alternative where bits AA are 11, is used to indicate that a single byte compression table has actually been generated and will be supplied within the compression string which follows. The remainder of the bits B through G in byte 0, line A, FIG. 6, are utilized as indicators to define which types or choices of other word dictionaries are employed in the compression routine for the given stream of compressed text that follows the header.

For example, bit B is defined in the present invention to be the indicator for an extended 3-byte wide address dictionary. If the value of bit B is 0 then no 3-byte dictionary is employed and if it is a 1 then some defineable 3-byte dictionary is employed. The definition of which 3-byte dictionary, if any, is employed is treated later in the header format as will become apparent.

Bit C through bit G are each individual bit indicators used in the same fashion as bit B but to indicate instead the usage of alternative 2-byte wide address dictionaries. In the example shown, five different 2-byte wide address dictionaries could possibly be employed.

The remainder of the bytes in the header and the manner of employing them in conjunction with the indicator bits in byte 0 will now be given.

Byte 1 will either be the start of compressed text or it will be interpreted as a control table number if an individual control table other than the default condition control table is to be employed. Byte 1 will be null if bits AA in byte 0 are either 00 or 11. If bits AA equal 10, then a control table number of eight bits' width will appear in byte 1 to identify a specific control table to be accessed by the decompression system from some external storage medium. If bits AA equal 11, then byte 1 will actually be the start of a supplied control table in the compressed text stream and byte 1 through byte n will be the supplied control table which will be the sum of the length of all the supplied words which are to be assigned in the control table plus 1,024 more bytes. One thousand and twenty-four is equal to 256 times 4, where 256 four-byte patterns are written. Byte 1 of each group of 4 bytes is a length indicator of a possible 256 byte sequence. The next 3 bytes in each group of 4 bytes are the sequence number of the word in a supplied dictionary string. Thus, the control table supplied, when appropriate, by bytes 1 through n will contain first, all of the supplied word entries and second, their assignment within the 256 byte array of a 1 byte control table arrangement. Each assignment requires 4 bytes where the first byte in a group of 4 indicates the lengths in bytes up to 256 bytes long of the entry and the next 3 bytes out of a group of 4 indicate the sequence number of the actual word which should be associated with the table entry when the word is supplied in the dictionary string that follows the control table definition portion.

In FIG. 6, line B, 3 byte dictionary table definition segments for the header will begin. At byte n+1, 3 byte dictionary definitions will occur based on whether byte 0 bit B was a 0 or a 1. For example, if bit B of byte 0 was 0, then fields BA, BB and BC in bytes n+1 and n+2 in FIG. 6, line B are null, i.e., no bits are present since no 3 byte dictionary is employed that needs to be defined in greater detail. However, if byte 0, bit B was equal to a 1, then field BA is 1 bit wide and field BB in byte n+1 is 7 bits wide. Byte BB is interpreted as the number of 65,536 word segments of a 3 byte dictionary that are employed. Field BC, which is byte n+2, will be the number indicating which 3 byte dictionary was used. Field BA defines whether fields BB and BC are necessary at all. If field BA is 0, then BC is null or no bits since no specific 3 byte dictionary needs to be defined, i.e., a default condition or a prearranged 3 byte dictionary will be used. If, however, field BA is set to 1, then field BC will be the identifying number of the selected 3 byte dictionary to be utilized.

Continuing with the convention of establishing the header format, byte N+3 is a definition section for the first possible 2 byte auxiliary dictionary which may or may not be employed. Byte 0 bit C defines whether or not a 2 byte dictionary of one type is to be employed. If byte 0 bit C is equal to 0, then the fields CA, CB, and CC in bytes n+3 and n+4 are all set to 0 since no further definition is necessary. If, however, byte 0 bit C is a 1, then field CA will be 1 bit and field CB will be 7 bits in width. Bit CA is an indicator which defines whether a default 2 byte dictionary or a specifically to be defined 2 byte dictionary has been employed. If CA is set to 0, then a default condition or prearranged 2 byte dictionary is used and byte n+4 field CC, which would ordinarily by the specific number for a given 2 byte dictionary, does not need to be given at all since the default condition is invoked. If, however, field CA is equal to 1, then field CD is the number of 256 word long segments that have been utilized for the first 2 byte dictionary being defined and field CC is the identifying number for that 2 byte dictionary.

This format or convention continues in the same fashion for byte n+5 through byte n+12 as shown in lines B, C and D of FIG. 6 in accordance with the status of bits D, E, F and G in byte 0, line A of FIG. 6 as just described. If all five possible indicators for 2 byte dictionaries in byte 0 are employed, then the start of actual compressed text will not begin until byte N+13 in line D of FIG. 6 and will continue for an indeterminant number of bytes until the end of text occurs at byte n+n in line D of FIG. 6.

Several illustrative examples of the first byte, byte 0, in a given header will now be described. Case 1: let us suppose that byte 0 of the header has been set to all 0's. Referring to FIG. 6, and the description given for it, a single byte compression technique has been defined as being used since none of the 2 or 3 byte indicator bits B through G are set to a 1. In addition, since both bits AA are set to 0, a default single byte compression table has been utilized and, since this is the default table, it is by convention already in existence in the address space for the decompression program at the receiver or user's end. This implies that the receiver and the sender have previously arranged via communication to establish their default table values and enter them into their respective systems. Since this is a 1 byte wide table, there are 256 possible entries. Some of the entries will be allocated for control sequences, some for special characters, and some for letters and digits. However, the bulk of the entries will be reserved for words with a high relative figure of merit as encountered in a particular user's installation vocabulary.

The actual number of control sequences, special character, letters or digits and words of high relative figure of merit are chosen by the particular user based on his own preferences and experience. A method of assigning these patterns typically would be for the user to scan a representative variety of texts from his or her environment to statistically isolate the highest relative figure of merit words as they occur in the working vocabulary of their installation. An example of a technique for doing this appears later within this specification. However, some of the 256 possible patterns will have to be assigned for the normally occurring controls that will be encountered. For example, a space character and all of the upper and lower case alpha and numeric characters are usually defined with separate entries. End of line and end of document control codes need to be reserved in each case and a multiple space code is a useful addition. Commas and space combinations or period and space combinations are also usual definitions, as are arbitrarily employed escape characters to indicate change of coding technique or the like. A table switching indicator byte pattern should also be reserved which can be used by convention to indicate that the byte in the text following the occurrence of this particular byte pattern will be a table number which is to be employed instead of the table currently being employed.

In the example given above where byte 0 is all 0's, the compressed text will start at byte 1 in the compressed text byte string and the header itself is a single byte, byte 0. With the naming and format convention as described in FIG. 6, the first byte, byte 0, of the header is the control byte which defines the specific array and type of dictionaries that have been employed and the remaining format of the header fields defines the specific individual lengths and identities of the auxiliary dictionaries that were in employed in the given compression of text being encoded.

Case 2: Let us assume that byte 2 is set to 1 and seven 0's. This by the convention established for FIG. 6 in this example, indicates that a single byte compression technique itself is employed but a non-default or auxiliary singly byte definition table will be used by the decompression algorithm which must access this table residing on some external storage medium. The table will normally have been given a name by the user consisting of an installation chosen prefix such as BASTAB followed by a suffix of numerical value contained in byte 1, for example, in the header string. A naming convention for single byte compression tables on an external storage medium might be, for example, "BASTAB.0" which would be a default table value or "BASTAB.1" which would be the table supplied within a compressed text byte string, and so forth. "BASTAB.n would be an additional table residing on an external storage medium where n could have any value between 2 and 255. In such a scheme, the actual compressed text string would then begin at relative byte position 2 within the compressed text byte string. During decompression, following reading of byte 0, the decompression program would access the indentified single byte compression table on the external storage medium and read it into the decompression program address space in read/write memory of the processor.

As noted above, one of the bit patterns within a single byte compression table is normally reserved for a table switching indicator byte. This would be used for switching from one single byte compression table to another. Whenever a table switch pattern is encountered in the compressed byte string, the next byte by convention would be encoded and interpreted as containing the number of the table to be utilized next. The new table would then be read from the external storage medium and placed in the decompression program addressable memory space if it did not already reside therein.

Case 3: Let us assume that byte 0 is set to 11000000. This convention in accordance with the description of FIG. 6 indicates that a single byte compression table has been employed and that the initial table to be used for decompression of the text will be the one which is actually transmitted within a compressed text byte string starting at the relative byte position number 3. The relative byte positions 1 and 2 in the text string following the header contain the binary value of the total length of the supplied single byte compression table. That table is supplied within the compressed byte strings and must be extracted from the compressed byte string and placed into the decompression program addressable memory space. The compressed text table will then begin at byte 3 and will end at a count defined by the length of the table which will then be followed by the beginning of the actual compressed text.

Case 4: Let us assume that byte 0 is set to 00100000. This pattern, according to the convention of FIG. 6, defines that a combination of a single byte compression table of a type defined as the default control table and a 3-byte dictionary of a type defined in field BA has been used. Byte n+1 in this case will be byte 1 since no control table number or supplied control table are required in this configuration for the header as specified. The seven low order bits of byte 1 will be the length as a number (less 1) of 65,536 word-long segments that were utilized in the 3-byte dictionary employed. Field BC which will be byte 2 would then define the identifying number for a 3-byte dictionary if a specific one is employed and byte 3 would be the start of the compressed text or in the event that field BA (the high order bit of byte 1) was 0 specifying the default 3 byte table condition, byte 2 would be the start of the compressed text.

The number of words in the 3-byte dictionary that has been specified is the number of 65,536 word groupings employed. Given that 7 bits can define the length, somewhere between 1 and 128 such groups could be defined. Therefore, the number of words in the total length of the dictionary of the 3 byte compression type will be at least 65,536 words but no more than 8,388,608. In a single byte compression control table a number of control patterns equal to the number of 65,536 word groups employed will have to be reserved to identify which section of the 3-byte dictionary is being utilized at any given time. Thus to encode the occurrence of a word found in a 3-byte dictionary, the first portion of its identifier will be the 1 byte identifier from the control table which will indicate that segment of the 3-byte dictionary which is found to contain the word. The next 2 bytes will indicate the relative offset within the segment of the dictionary where the actual word encoded is found.

Thus, if a single group of 65,536 words were used in a 3 byte compression table, a single 1 byte bit pattern in a single byte compression control table will be used to tell the decompression program that the 3 byte decompression dictionary is necessary. When the decompression routine encounters the specific single byte pattern in the compressed text byte string, the subsequent 2 bytes must be read together to specify which word within the 65,536 word 3 byte dictionary is being represented from the original text.

As an aside, it may be noted that if the number of such 65,536 word groups is relatively small, then given the availability of random access memory in small systems today, the entire 3 byte compression dictionary may be loaded into the address space of the decompression program. Since each group of 65,536 words will typically occupy somewhat less than one-half a megabyte of storage, given the average word length of around five characters, it is feasible on large processors, that several megabytes of address space could be effectively allocated to a decompression program space. On small processors, there is usually room for only a few such groups in order to reserve sufficient address space for the operating program.

In the case where the 3-byte dictionary is larger than is desirable for placement in address space of the decompression program, the dictionary will be accessed from the external storage medium in 65,536 word segments as required. There are also techniques available for minimizing the amount of external storage space required to contain the actual 3-byte dictionary. Many of these techniques are known, such as the virtual storage access method utilized by IBM and others. The technique is to minimize the external storage requirements if any is actually used and is not particularly germaine to this invention.

As alluded to earlier, one bit pattern within a single byte compression table should be reserved for a table switch indicator. If a 3 byte table has been employed, a 3 byte table switch indicator should be reserved. Thus, when the decompression algorithm encounters this specific pattern, the subsequent byte could contain the name of the particular 3-byte dictionary which is to be accessed on the external storage medium.

Case 5: Let us assume that byte 0 takes on any of the values 00010000 or 00001000 or 00000100 or 00000010 or 00000001. In this example, any of five different types of 2 byte compression dictionaries are being employed. The restriction to five types is arbitrary and is based upon the use of an 8 bit byte format for byte 0 in line A of FIG. 6. If more than five types of 2 byte dictionaries are required, byte 0 as used in this discussion may be expanded to be a 16 bit field or more. In any event, the number of 2 byte dictionaries that one might utilize could be one or more of any of the following or other types: a dictionary unique to the document itself, i.e., one that has been generated by a scanning and prioritizing routine that will be described below has resulted in the construction of a unique dictionary that is actually supplied with the text. Or an auxiliary dictionary containing special jargon, proper names, etc., where the field of a particular user's environment has been employed. Or a personal dictionary for the unique vocabulary of a specific person or groups of people has been employed, or a graphics dictionary or an audio dictionary, etc., etc. It will be noted that a virtually limitless number of such dictionaries may be defined and utilized and that the fact of their utilization may be communicated effectively to the decompression routine or user.

As with the 3-byte dictionary example above, each of the 2 byte dictionaries can have a bit pattern within the single byte compression control table which is utilized as a dictionary version switch indicator for the type of dictionary being used. Of course, a number of bit patterns in the single byte compression control table equal to the value of the number of segments of 256 words utilized in all of the chosen 2 byte dictionaries will have to be reserved as well. When the decompression algorithm encounters any of these bit patterns in the compressed text byte string, it will by definition take the subsequent byte as meaning the number of the word within a specific 256 word grouping identified by the first byte from a given identified 2 byte dictionary. Since each 256 word segment from each dictionary has its own control pattern assigned, there is no ambiguity and the specific dictionary and the specific 256 word segment of that dictionary are known from the control pattern itself so only the specific number of the word within that grouping must be conveyed. Consequently, only 2 bytes are necessary to encode a word appearing within a 2 byte dictionary. The first byte must match one of the control patterns stored in the single byte compression control table. The second byte is the number or sequence number of the word itself within that specific 256 word segment of the 2 byte dictionary in which it was found.

As is apparent from the definition given above and the discussion pertinent to FIG. 6, numerous permutations of the bit patterns in byte 0 of the header can be employed. In fact, 256 different patterns arbitrarily exist given an 8 bit byte format for byte 0. The bytes which follow byte 0 in the header are evaluated in a sequence defined by the order of preference for the dictionaries employed as was alluded to earlier with regard to the discussion of FIG. 6. For example, if byte 0 were encoded as 00100000, a single byte compression table using the default values for the compression table and a default 3 byte compression dictionary are employed. Byte 1 by convention must then define the length of the default 3 byte compression dictionary, i.e., field BA of byte n+1 in FIG. 6 will be set to 0 and field BB is the length as the number of 65,536 word segments actually employed in the dictionary.

As is apparent from the foregoing discussion, multiple dictionaries may be used and in the general case, each dictionary may contain up to j segments. A given segment for a given dictionary D will thus be defined by D(i,j) and can be invoked by a particular bit pattern resident within the control table. The sum of the number of segments employed for all dictionaries used in a given compression example must be reserved in individual bit patterns within the control table to identify the segments as they occur in the compressed text string. That is, there will be one bit pattern in the control table for each segment of each identified dictionary that is employed in the compressed text string. Thus, the number of word or phrases represented by a single byte in the compressed data set will be the total number possible in a single byte, 256 less the total number of all segments that must have identifiers reserved for them in the control table and less the number of control bit patterns set aside within the control table for special characters, letters, numbers and control sequences or signals. By an arbitrary convention employed herein, the number of bit patterns within the control table used to identify dictionary segments is assigned sequentially starting at the top of the control table, i.e., with a bit pattern of all 1's and proceeding to lower numbered bit patterns until the total number of dictionary segments have all been assigned. Any remaining control table spaces may then be assigned for the control bit patterns, special characters, letters, numbers and the like and any remaining spaces can be given over to the highest figure of merit words.

As is also implicit in the foregoing convention, the search of dictionaries at the encoding end will be in a priority defined by the one using the compression technique. The typical sequence for the search would be to first search the control table of the single byte compressed word patterns followed by the search of the 2 byte dictionaries if any are used, and last of all, the 3 byte dictionary if one is used.

As noted earlier, the number of 2 byte dictionaries in the examples given has been arbitrarily limited to five by the 8 bit byte format for byte 0. However, each of the 2 byte dictionaries employed and the control table itself and any 3 byte dictionaries may each have up to 256 versions thereof that may be invoked by inserting the version switch bit pattern for that type of dictionary into the compressed string and followed by convention by a byte identifying which version of that dictionary is to be accessed next.

As an example of the assignments of the control table, consider an example where a 3 byte dictionary consisting of 16 segments of 65,536 words each (for a total of 1,048,576 words) has been arbitrarily selected and referred to as dictionary A. Also assume that a 2 byte dictionary consisting of 32 segments of 256 words each (for a total of 8,192 words) has been arbitrarily selected and is referred to as dictionary B. Assume further that a 2 byte dictionary consisting of only 8 segments of 256 words each (for a total of 2,048 words) has been selected and referred to as dictionary C for compressing the text. The following steps would be taken in allocating the control bit patterns in a single byte control table.

First, sixteen 8 bit patterns would be allocated in the control table to represent the sixteen segments of the 3 byte dictionary A. Next, thirty-two 8 bit patterns would be allocated to represent the 32 segments of the 2 byte dictionary B and then eight 8 bit patterns would be allocated to represent the 8 segments of the 2 byte dictionary C. Then a number of 8 bit control patterns would be allocated for the various special characters, control sequences, letters, numerals, etc., to be encountered. Any remaining bit patterns out of the 256 original possible patterns in the control table of single byte width would then be allocated to the highest relative merit words which are selected in accordance with the technique to be described further herein. Lastly, the specific dictionaries indicated by the encoding group which had made the selection of these dictionaries will be read into memory for beginning the compression routine.

In order to describe the working compression routine, a somewhat more detailed analysis of the system and its method of operation will now be given.

Turning to FIG. 1, an overall system diagram for a typical text compression or expansion operation in accordance with the preferred embodiment of this invention is shown. Text input sources may be a typical read/write disk, a keyboard controlled by a human operator, a cassette or a communication network adapter where the incoming ASCII or EBCDIC encoded text is received from some remote location. The text input devices are generally grouped together as "text input" and labeled 1 in the dotted line box in FIG. 1. A multiplexer 2 is indicated next for receiving and selecting in accordance with addresses received on the address bus 3 from microprocessor 4 one of the possible inputs for an input source of text to be compressed or decompressed. It should be understood that individual adapters for the disk or the keyboard, the cassette or the communication network adapter would be provided to convert signals from the medium represented to the proper voltage level and format for presentation to the multiplexer 2. Either serial or parallel adapters to convert from serial to parallel or parallel to serial format are connected to the other side of the multiplexer 2 as shown by the adapters 5 and 6, respectively, which permit usage of either serial or parallel address and data busses in the system and allow for proper communication through the multiplexer 2 to either serial or parallel input or output devices within the dotted box 1. A main control storage, which would be read only in most embodiments, is indicated as the control storage 7 which is connected to the address and data busses of the controlling microprocessor 4. Bulk storage in the form of disk storage or the like is indicated as bulk storage 8. The remaining boxes 9, 10 and 11 indicated portions of read/write addressable memory configured by the control microprocessor and used for its working memory space. A portion 9 contains the main dictionaries together with their indices and dictionary segment maps as well as the control table that has been referred to at length earlier, all of which have been read in from the bulk storage 8 in accordance with a given selection by a user or in response to the reading of byte 0 of the header described earlier.

Box 10 contains a transmit I/O buffer and box 11 a receive I/O buffer. These buffers would be configured in the addressable memory space as areas in which data to be compressed or decompressed will be temporarily buffered during operation of the compression or decompression algorithms to be described. The assignment of spaces within the main memory 9 for the dictionaries will also include dictionary segment indices and dictionary segment maps as will be described further below.

Assuming that the individual dictionaries indicated by a given user have been read into memory 9, the processor 4 will construct indices to minimize the dictionary search time. These may have been previously constructed and read in at the time the dictionaries themselves are loaded from bulk storage 8. The index set consists of a set of members, each member of which will contain the segment number which is reserved in the control table to be defined for that segment. The index member has two entries for the length of a word and the word itself for the lowest or first entry of that dictionary segment in the collation order of words being used. The index member also has two entries for the last or highest collation order word entry in that segment for the word's length and for the word itself. In other words, the dictionary segment index contains, for each segment to be defined, a length and an actual word entry for the lowest order collation entry appearing within that segment alphabetically and a length and actual word entry for the highest collation order entry appearing within that segment. The collation order may usually be alphabetic. An example collation order is shown in FIG. 2.

Figure 2:
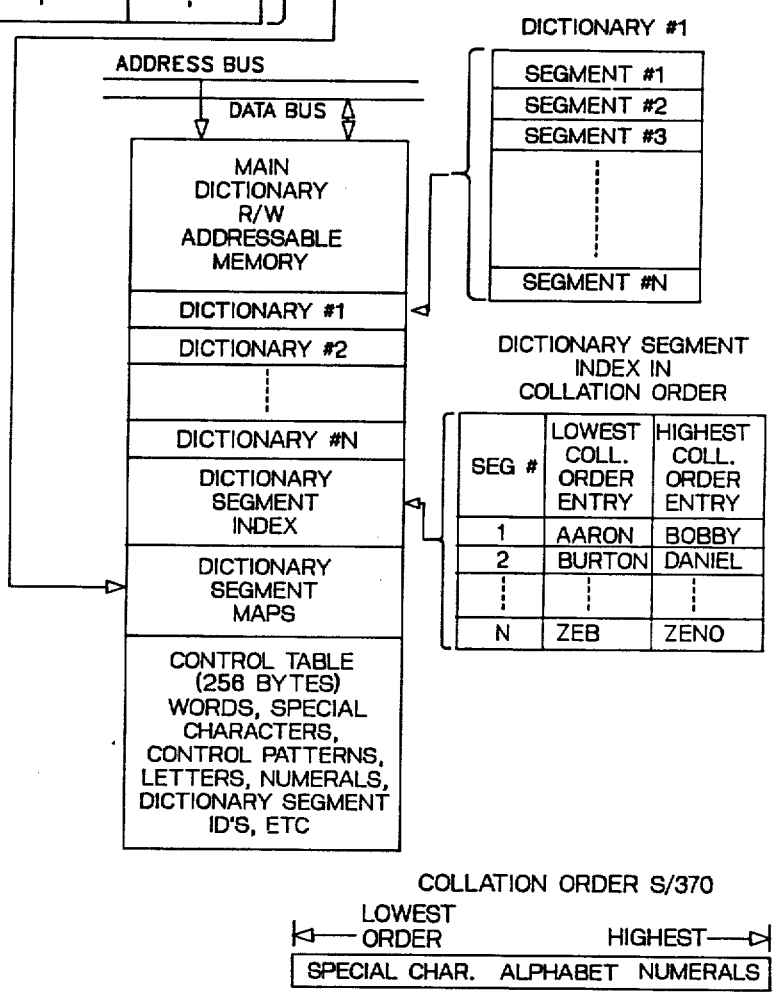
FIG. 2 is a schematic illustration of the assignment of memory space into segments containing the actual dictionaries employed, an index for each dictionary segment and dictionary segment maps as well as control tables for use in compression and decompression.

The collation order assumed for the example of FIG. 2 is that used in the IBM System/370 computer architecture. This is an assigned hierarchical sorting collation order with special characters first in a defined order that is known to users of such systems, followed by the alphabet upper and lower case and last, by the numerals in the highest collation order of sequence. The collation order may be viewed as equivalent to an overall "alphabetic order" for the possible entries to be sorted. The actual dictionary entries for each dictionary are thus collated first and sorted into the collation order. Each dictionary segment thus begins with some low collation order entry of a given length and a given entry word (or number or character as the case may be) and the segment index ends with the highest collation order entry that appears within that segment of the dictionary being used. The dictionary segment index is used to speed dictionary search time using binary search techniques as will be described.

In the example given above, there would be 56 segments defined in the dictionary segment index as shown in FIG. 2. There would be 32 segments for the 3 byte dictionary and 16 segments and 8 segments, respectively, for the additional 2 byte dictionaries that were selected. No segments are absolutely necessary for the single byte control table entries since those can be searched quickly on a single byte basis, but segment indices for the single byte table are employed for consistency.

Additionally, a dictionary segment memory map for correlating the actual segment number and entry positions with starting memory address locations is constructed. This contains the segment number, the length of the first entry in number of characters and the starting memory address at which such entry appears. It is followed by the next entry within that segment, with a length and a starting address, etc., until all of the segments and all of the characters lengths and all of the starting memory addresses have been loaded into the dictionary segment memory map. This greatly facilitates the binary search technique as will be described later since it is possible to find a matching entry for a given word to be compressed or expanded much faster if a binary search technique is used for searching the dictionary entries. The dictionary segment memory map will also contain entries for the words within the control table. In the given example above, there would be 168 bit patterns left in the control table after the assignment of the usual special characters and the dictionary segment indicators has been completed.

If a compression routine were being followed, the header describing the particular dictionary selection made for this compression would then be written to a compressed data set. For example, the header would be 0011100 followed by 00001111 followed by 00011111 followed by 00000111 in the example given above. This will define the fact that a 3 byte dictionary consisting of 16 segments, a 2 byte dictionary consisting of 32 segments and another 2 byte dictionary consisting of 8 segments are being employed. In addition, the first byte 00111000 specifies the fact that all the dictionaries and the control table have been set to be their default value definitions because the first bit of each of the following 3 bytes is set to 0 as shown in the example.

Next, the given text input or document would be scanned and a word would be extracted. This is usually performed as is known in the prior art by examining the text stream until the punctuation mark or a space following a character code is encountered. The group of character codes and a space code are then viewed as a "word" to be compared against dictionary entries. Capitalization is handled similarly and a code is written to the compressed data set indicating capitalization if it is detected. An appropriate control sequence will be written for the compressed data set and the first character will be changed back to a lower case for dictionary searching. An "all characters capitalized" condition may also exist and an appropriate control sequence can be written to the compressed data set for this condition with all of the characters then converted to lower case for searching.

Next, the word would be checked against the entries in the control table which represent the highest relative priority or figure of merit words. This is done using the control table dictionary segment memory map of FIG. 2 utilizing a binary search technique. If a match occurs between the input word and an entry in the control table word list, then the single byte pattern representing that word is written to the compressed data set and the process would continue from the step just previous to this.

If no match in the single byte control table occurs, an index set is used to determine which segment within the first 2 byte dictionary may possibly contain the word if it is to be found within the first 2 byte dictionary. The dictionary segment index of FIG. 2 is utilized for this purpose. This is done by selecting the first member of the index set and comparing the word against the lowest and against the highest entry in the segment that the index member represents. If the word is contained within the collating sequence range of the lowest and highest entries of a given index set member for a given segment, then a binary search of the words within that specific segment will be conducted in the dictionary segment memory map to determine if the word to be compressed is actually contained within the specific directory being searched. This binary search uses the dictionary segment memory map to find a target memory address. If a match is found, the segment number and the single byte word number within the segment are written. In the case of a 3 byte dictionary, the offset for word number will require 2 bytes following the segment number.

If no match is found in one defined 2 byte dictionary, then the subsequent 2 byte dictionary will be searched until all 2 byte dictionaries defined have been reviewed. If no match is found in any of these dictionaries, then the search continues.

If no match is found in any dictionary, then the word can be spelled out utilizing one of two methods. Either the word may be uncompressed and simply sent as EBCDIC or ASCII representation character by character until the word has been completely transmitted or written to the compressed data text, or a special control sequence can be written to the compressed data text followed by the uncompressed character representations and followed by another control sequence byte to indicate that the end of the uncompressed portion has been reached. The selection of which technique is employed is arbitrary. The use of the escape sequences or control sequences to indicate the occurrence of the uncompressed portion of text entails that very few control sequences need to be specified in the single byte control table. However, if the individual character's representations have been reserved in the control table, it is unnecessary to indicate the fact that uncompressed text follows by entering a control sequence or escape sequence into the compressed text stream. This is true because the uncompressed EBCDIC or ASCII characters will be accurately received and decoded since they will find matching entries in the control table.

An example of a complete data compression algorithm flow chart that would enable any skilled programmer given an individual microprocessor and operating program language for it, is given. It is given in the form of a flow chart which can be easily converted by such a person to an operating program.

FIG. 4 illustrates the complete flow chart for a variety of compression options using different types of dictionaries. While the flow chart is self-explanatory and can be easily converted to a set of microprocessor instructions, a few observations on the general flow chart and specifics of the technique of compression involved are offered.

The first task begins in box 12 of FIG. 4 where the compression routine is begun. The first question asked in box 13 is whether the user has selected a single byte table alone to be used in its default condition for compression. If the answer is yes, a header of all 0's is written as directed in box 14 and compression of the document is begun in box 32. The routine is to fetch individual characters singly from the document file that contains the EBCDIC or ASCII code of the document to be compressed. Any time the character is a word ending, i.e., a space or a punctuation mark is found or the document end character is found, a word is defined as having been isolated. The entire word is then compared against a single byte compression table using the binary search technique described earlier. If a true comparison or match is found, the bit value corresponding to the address location of the word within the single byte table is written as the compressed version of the word. This will be placed in buffer 10 in FIG. 1, for example, to build an outgoing compressed text or it could be placed in main memory 9 at the user's option. In box 38, the question is asked whether the end of text indicator has been found at the last word isolated, and if it is, the end of text bit pattern must be written to the compressed data set and the compression program ends. If the answer to the question in box 32 is no, the word buffer in box 11 of FIG. 1 is cleared and the program routine loops back to begin by fetching another character from the document file and placing it in the word buffer 11 in box 33. The process continues until all of the words in the document have been encoded or have been treated in the alternative fashion by being spelled out when no match has been found in any of the dictionaries being employed. This portion of the routine is found at the exit from block 36 which directs the flow to box 43. If the single byte table is the only one being used, then in the event of a no match condition, it is necessary to either spell the word out directly utilizing the EBCDIC or ASCII characters as have been previously discussed in this specification, or to signify this change in encoding by writing an escape bit pattern to the compressed data set as is shown in box 44. This would be followed if an escape pattern is used, by writing each character from the word buffer 11 to the compressed data set and finishing the string of uncompressed characters with another escape bit pattern. As has been noted earlier, the escape bit pattern is not necessary in the event that the single byte buffer contains codes for all of the normal letters and characters as would be the ordinary case. It would only be necessary, having found no match between the word comparison and the contents of the single byte buffer for words, to conclude that the word in the buffer should be written character by character into the compressed data set. It would then be recognized in a decompression program since no word match would be found by comparing character by character against the contents of the single byte table; but a "character" match would be found where the characters have been previously stored. This technique is not shown in the flow chart but is evident from this discussion.

Box 43 in FIG. 4 also shows the hierarchy of searching that is contained in this routine. If the single byte table is not the only one being searched, then the word buffer contents are compared against any 2byte dictionaries that have been selected by the user as shown in block 45. If a match is not found in any of the 2 byte dictionaries, then the question is asked in block 47 as to whether a 3 byte dictionary is to be used and if the answer is yes, the comparison is made against the 3 byte dictionary being used until a match is found or, if no match is found, the program loops back to the block 44 to write the word in its uncompressed form as discussed previously.

Returning to block 18 of FIG. 4, if a single byte dictionary or table is to be generated based upon the contents of the document to be compressed, i.e., if a special dictionary for the document under study is to be generated, the program begins in block 19 by opening the document file, i.e., initializing an area in memory where processing of the document word by word can be conducted and then proceeds to block 20. The document words are scanned and a list is constructed in memory of all of the individual unique words found within the document. A count of the number of occurrences of each unique word is also maintained. When this has been completed, the relative weighted figure of merit for each word in the document is computed by multiplying the count of the number of occurrences of each word by the length in characters of the word. The resulting figures of merit are sorted by magnitude with the highest magnitude (highest figure of merit words) being assigned to bit positions that remain within the single byte table (after assignment of alphas, numerics, special characters and the control characters has been completed). The user will have to define how many bit patterns will be available in a single byte table by a judicious selection of the control characters, etc. This will leave a certain number out of the 256 possible patterns available. A unique header is then written in box 28 to begin the compressed data stream. This is followed as shown in box 29 by the segment memory location map, a 2 byte pattern indicating the length of all the words that are represented in the single byte table from box 26, and followed by the actual list of words to be used in the dictionary as shown in box 31. The program then moves to the compression routine beginning in box 33 as shown.

If a 3 byte dictionary or a 2 byte dictionary are defined as being necessary, boxes 52 and 62 described the sequence of events. The particular selection of dictionaries that has been made by the user invoking the compression routine is noted and generated as a dictionary structure as shown in box 68 for any other set of selections other than those specifically described. Each of the elements of the flow chart in FIG. 4 handles any of the possibilities for writing single byte compression tables, single byte auxiliary compression tables, 2 byte or 3 byte dictionaries of any style. Selection of which dictionaries are to be used is left completely at the discretion of the person invoking the compression routine. The resulting selection of dictionaries is then reflected in the construction of the information header that begins the compressed data stream as described in great detail earlier. When the header has been constructed, the compression routine follows as shown in FIG. 4 through an analysis pattern for comparing each word against the selected list of dictionaries to be utilized and for constructing the compressed data set according to the instruction in FIG. 4.

Figure 3:
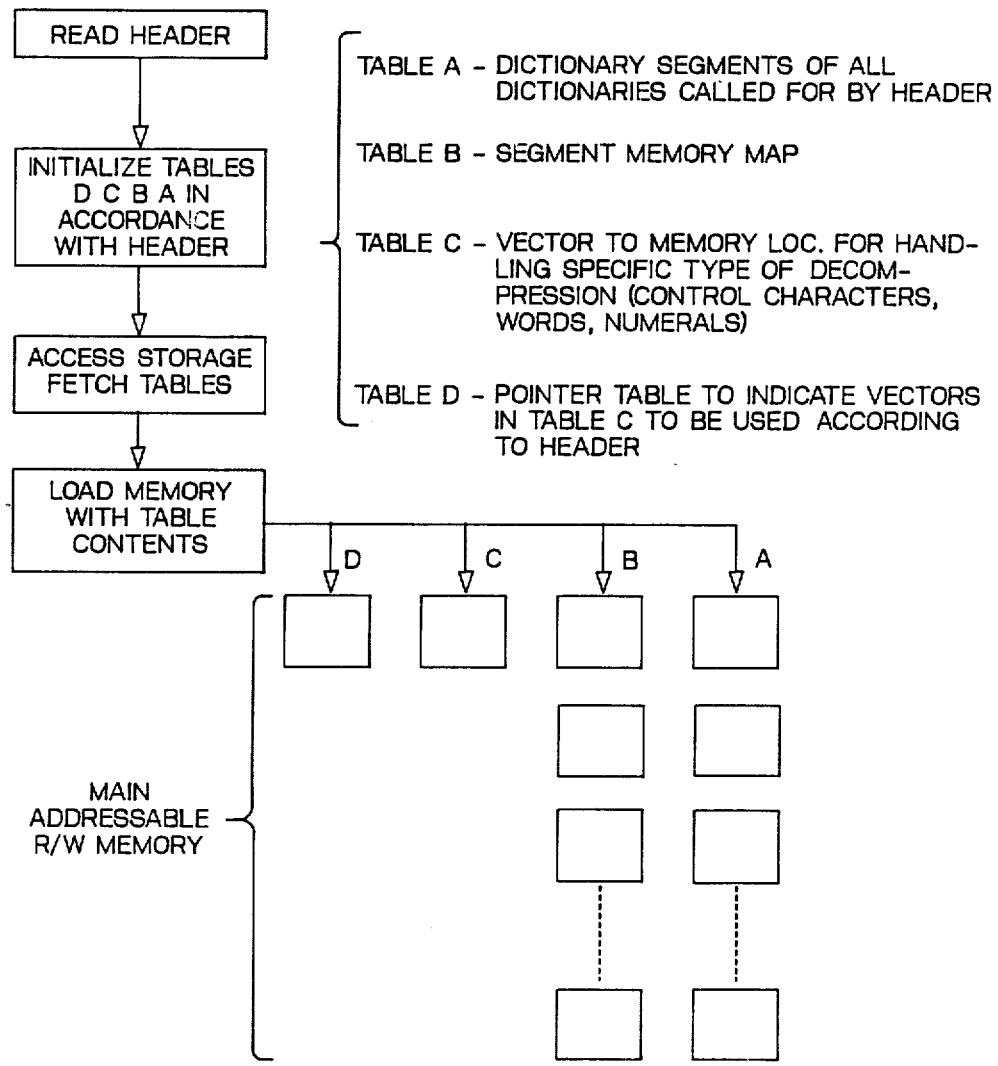
FIG. 3 illustrates schematically the decompression logic flow practiced by the processor in FIG. 1.
Figures 1, 4A:
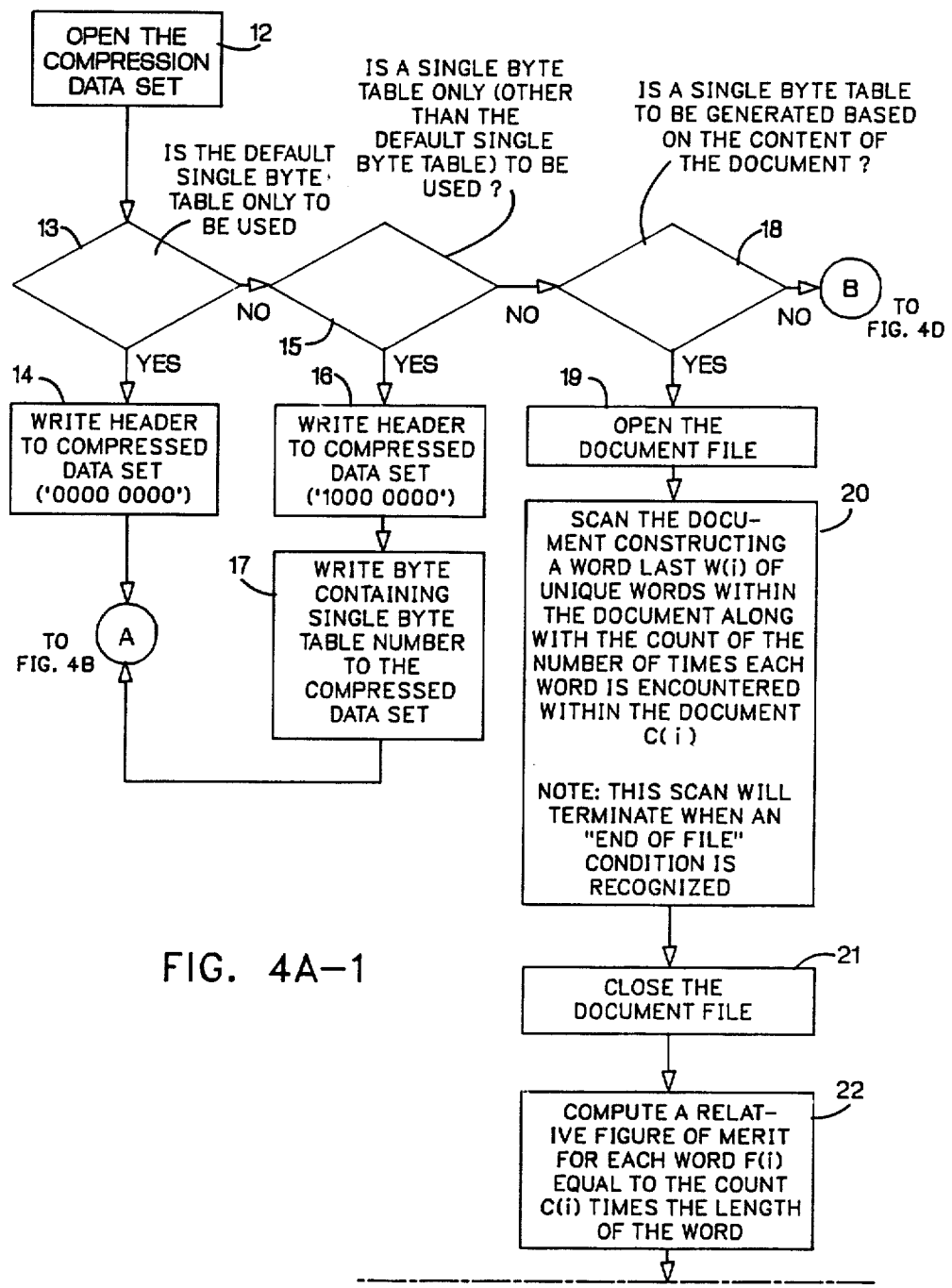
Figure 4B:
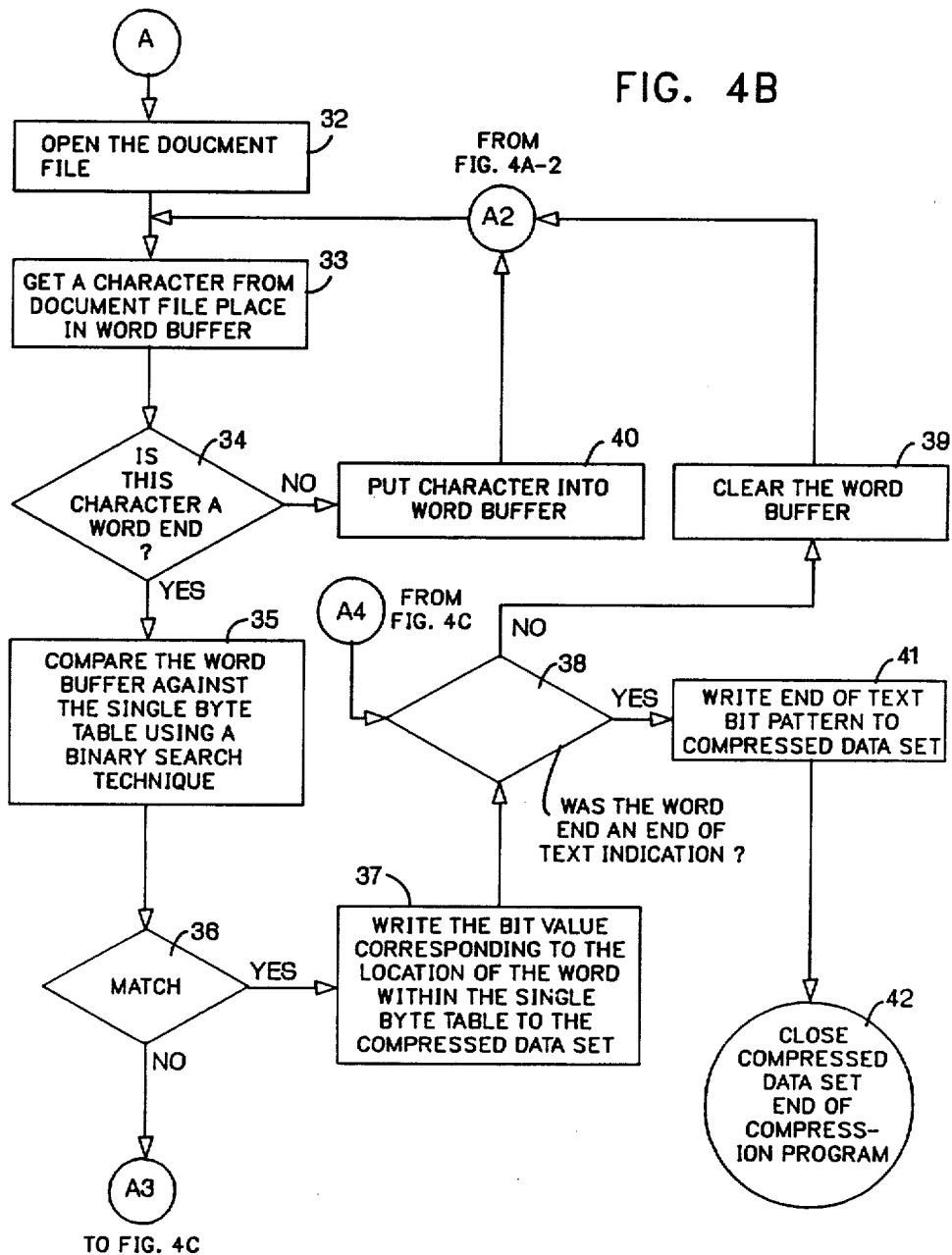
Figure 4C:
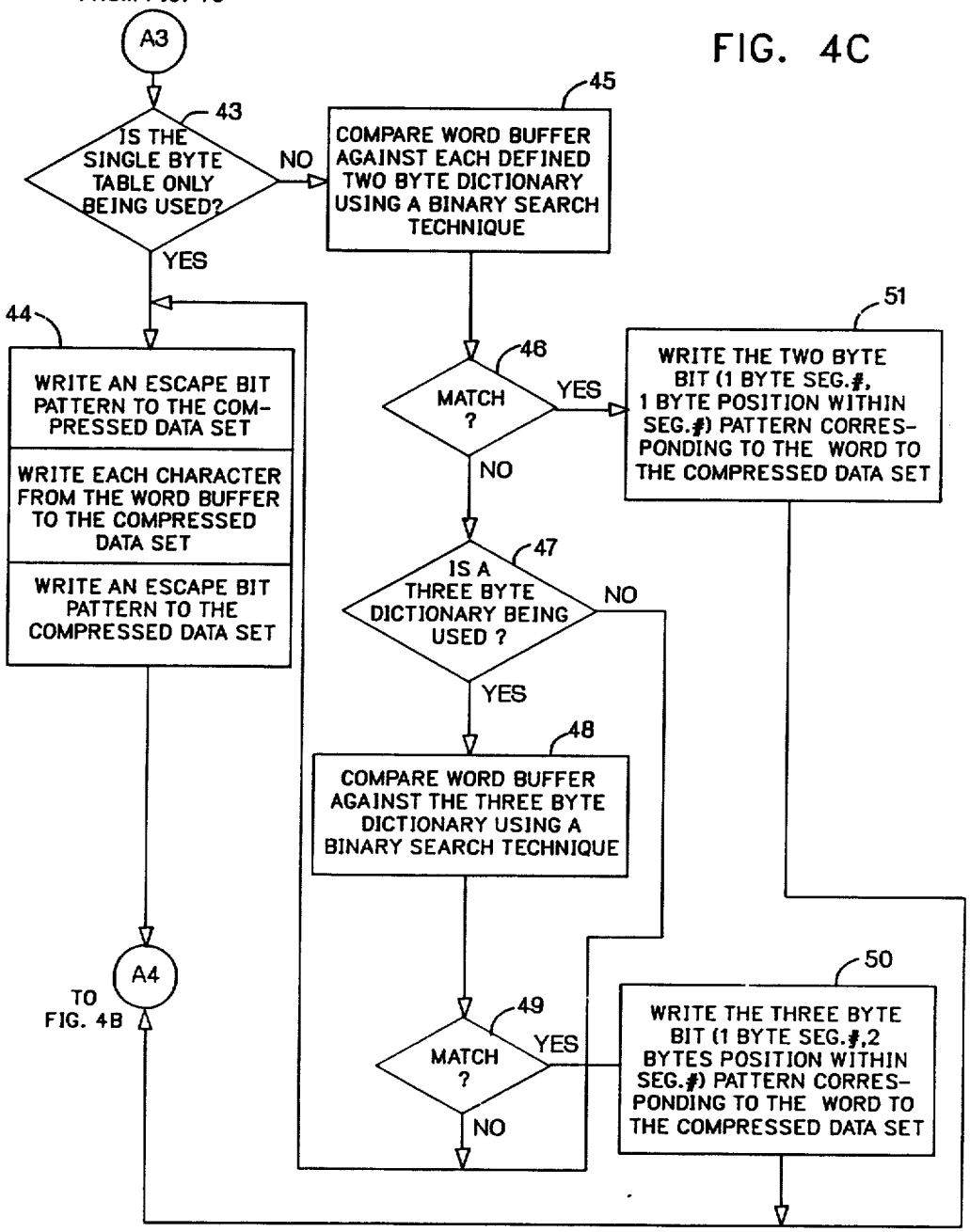
Figure 4D:
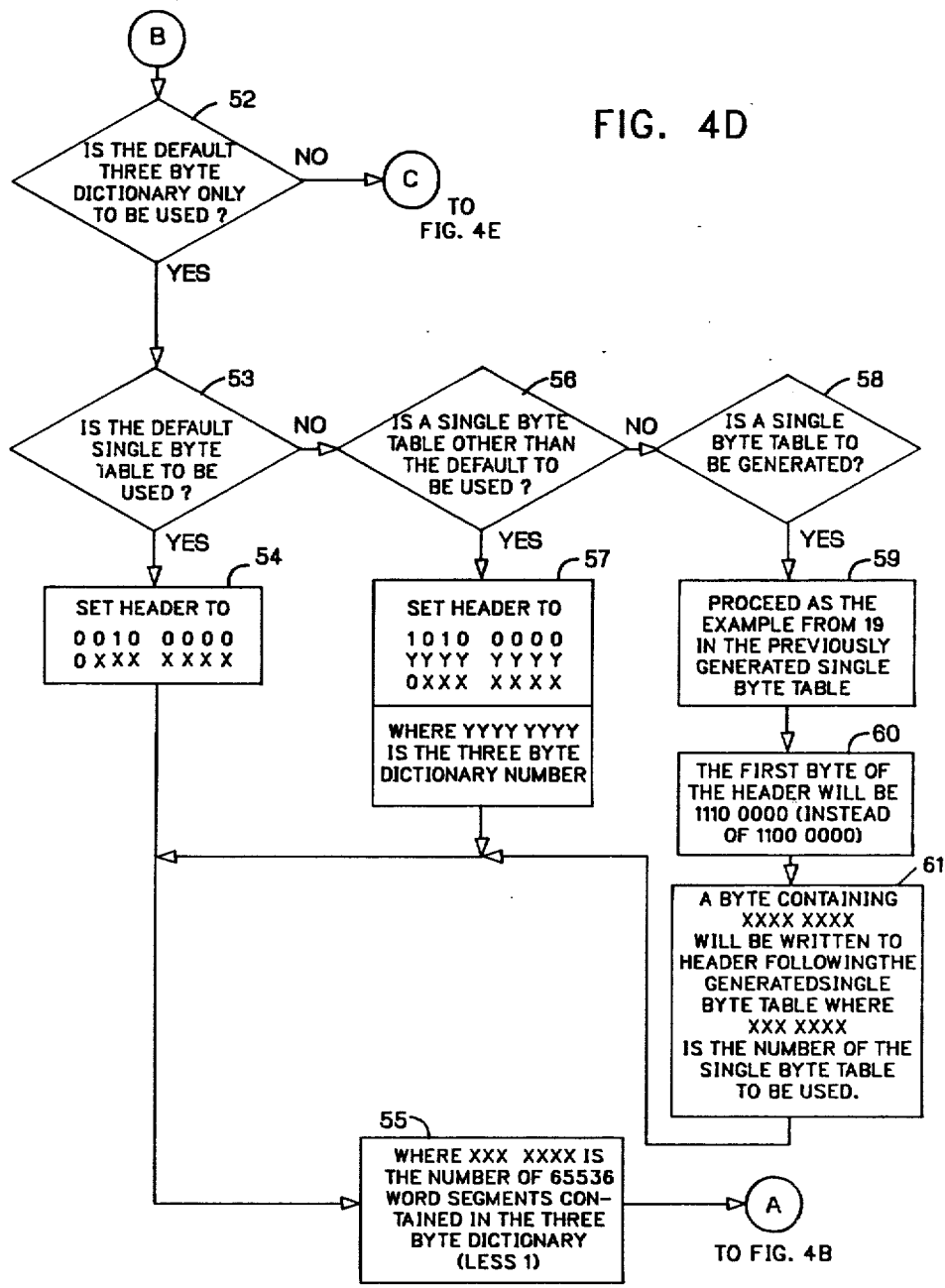
Figure 4E:
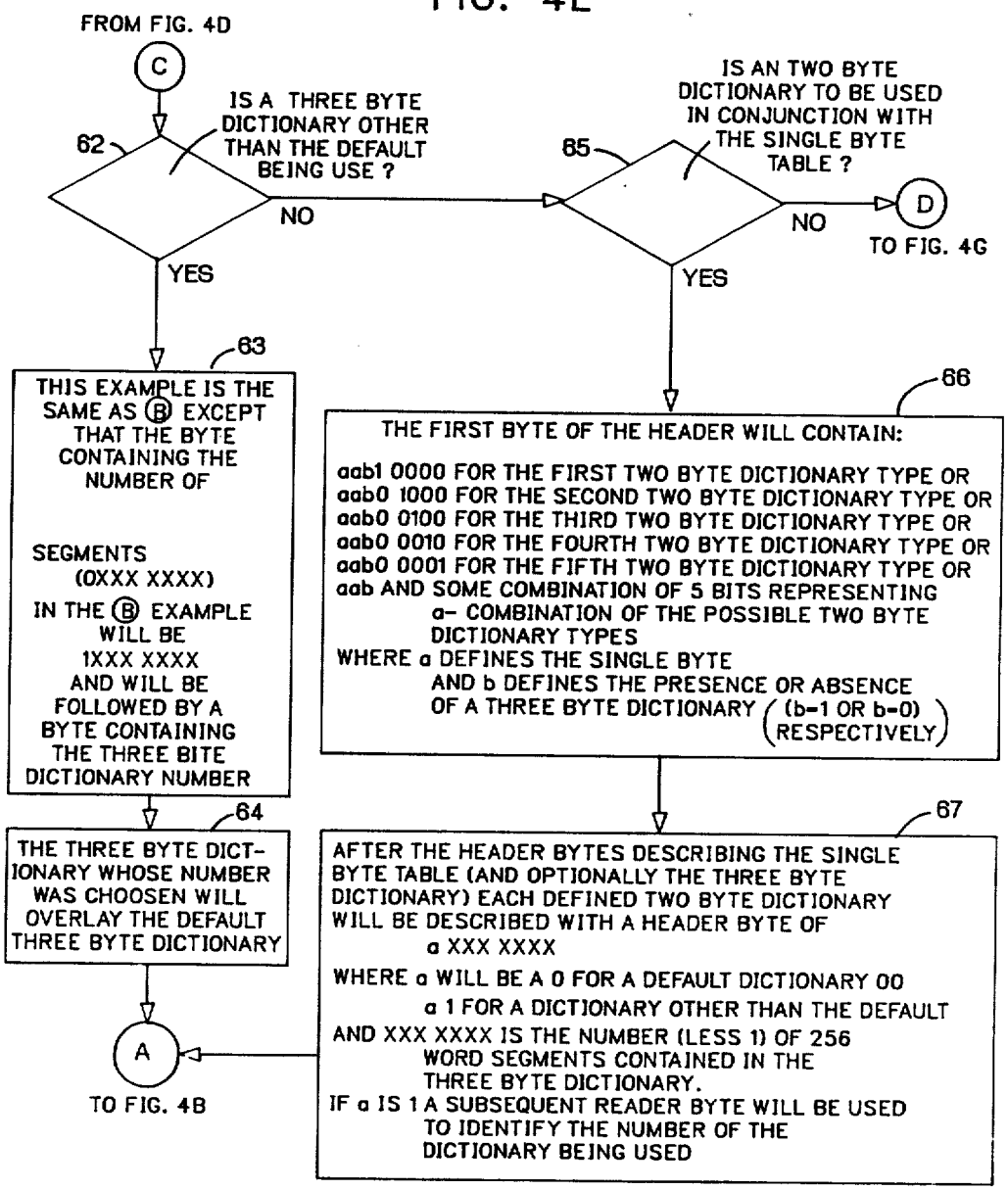

Decompression is a very straightforward operation and is described with relation to FIG. 3. A number of tables A, B, C and D will be defined as sections in main addressable memory 9. The value loaded into the tables D, C, B and A are written in accordance with the header received for the compressed data set. Analysis of the header enables the program in the microprocessor to access the bulk storage or memory and to fetch the necessary values to initialize the tables D, C, B and A as shown in FIG. 3.

The description given for FIG. 3 shows decompression of text being accomplished by using an indirect addressing scheme. The four memory tables D, C, B and A associated with the decompression program are defined as follows. Table D is used to map the bit patterns of the first byte of the compressed stream into a series of offsets within table C. In other words, table C contains all of the possible permutations for the first byte of the header and table D is used to analyze the header and select which of the patterns should be indicated in table C. Table C is a transfer vector table which indicates which selection of subroutines within the decompression program must be invoked to handle decompression of each word, phrase, control sequence letter or numeral as the case may be. In other words, table D is used as a comparison against the header to analyze the header and identify which dictionaries are to be employed. Table C contains directions to the subroutines that will be required to handle each type of decompression.

Each unique version of each dictionary that has been specified in the header has also two additional tables A and B defined for it. Table B is an indirect address table containing a 2 byte reserved field and a 2 byte word length field and a 4 byte address field. Table B is thus the segment memory location map for the dictionary in question. The second table, table A, contains the decompressed words themselves and is the dictionary word list.

For the decompression routine, the header is analyzed to determine which dictionary structure has been specified. A detailed example assuming the existence of general register space available in main memory 9 will now be given.

If a default single byte table alone is to be employed, a pointer is initialized arbitrarily in a general purpose register R3 within main memory 9. The pointer is initialized to indicated the byte number in the compressed test at which point the first byte of the compressed itself begins. Another pointer is established in another arbitrary general purpose register memory, R4. It is initialized to point at the address in the storage space of memory 9 where the decompressed text storage area begins. Another pointer, arbitrarily initialized in general purpose register space R5, is initialized to point to the address in memory where the beginning of table D is located. Another pointer is initialized in an arbitrary general purpose register R6 to point to the beginning of table C within memory. Yet another pointer is initialized arbitrarily in a general purpose register R7 pointing to the beginning of table B and another register is initialized R8, containing a pointer to the beginning of table A. The values for these tables are then fetched from storage 8, for example, and loaded into the main memory beginning at the points identified by the pointers in the registers just described.

Then decompression begins. A byte is fetched from the compressed text beginning at the location described by the pointer and is placed in a general purpose register R9 defined in FIG. 1 as receiving buffer 11. In other words, R9 is loaded with the byte from the location indicated by the content of register R3. The beginning address of table D may then be added to the content of the general purpose register R9, i.e., the value of R5 is added to R9. This yields a new value for a byte at a location indicated by R9 which is loaded into the general purpose register R10. This is the mapping byte selected as the result of the pattern found in the first byte of compressed text and defines whether the byte represents a word, a control character, a special symbol, a control sequence, a letter or a digit, etc.

The mapping byte is arbitrarily multiplied by 4, i.e., R10 is shifted to the left two position, and the beginning address for table C, which is the transfer vector table, is added to the product thus obtained. This yields control of the operation to the subroutine whose location is indicated in the transfer vector table at the position now indicated in register R10. That portion of the subroutine is then initialized to handle the special symbol, control sequence, letter or digit that has been identified by the mapping byte table. Special symbols, control sequences, letter, digits, etc., each have a unique subroutine. However, words in the single byte compression table all share a common subroutine for decompression. The subroutine for word decompression exists in memory and handles words that will be found in the single byte compression table. It fetches the compressed byte from the compressed text byte string by loading R9 with the byte from the location indicated by R3. The value of the compressed byte in R9 is multiplied by 8 arbitrarily, i.e., shifter 3 bit positions to the left and the beginning address of table B is added to the resulting product. In other words, R7's contents are added to R9 which yields a pointer to the length and location of the decompressed word itself. The length and location of the word are indicated by two more than the value of R9 and four more than the value of R9, respectively. These values are loaded into general purpose registers R10 and R11, respectively. The result is the decompressed word itself which will be moved from the dictionary word memory of table A to the decompressed text work area in main memory 9. In the example given, the word from the location indicated in R11 having a length indicated by the content of R10 will be moved to the location indicated by R4. Pointers will then be updated for the position of the next compressed byte and for the location of the next decompressed text entry. In the example given, register R3 will be augmented by 1 and the value of R10 will be added to R4. The decompression program then loops back to fetch the next byte from the compressed byte string and repeats the process given above.

Control of the decompression routine is transferred to an end of file subroutine upon recognition of an end of file control character or sequence. The end of file subroutine then disposes of the compressed data stream in the manner selected by the user, i.e., it may be outputted through the multiplexer 2 to a communication network adapter for communication to a remote location or stored on a disk or cassette in box 1 as indicated in FIG. 1. Alternatively, it could also be loaded into disk bulk storage 8 for retrieval at a later time.

For the case of a decompression routine using an alternate single byte compression table or, in the event that a table switch character has been indicated in a control sequence found within the compressed text byte string, alternative tables' values for tables A, B, C and D will be accessed from storage and loaded into the working memory space overlaying the existing table values for A, B, C and D. The decompression routing then proceeds as described above. In the event that a single byte compression table and some additional dictionaries have been specified, the header indicates which single byte compression table and which other dictionaries have been specified and the number of segments for each of the other specified dictionaries which are to be used. Appropriate table values for A, B, C and D are then loaded from the predefined external storage medium and located in the address space of the decompression program as noted above and decompression proceeds as described. Each segment of each dictionary will have its own corresponding subroutines to map the compressed byte or bytes into the proper word within the indicated segment of the indicated dictionary. In the case of a 2 byte dictionary, for example, the subroutine for a particular segment of a particular 2 byte dictionary will use the second byte of the 2 byte compressed representation of the word as an offset into the proper table B to find the decompressed word within the word dictionary, table A. In the case of a 3 byte dictionary, the subroutine for the particular segment of the 3 byte dictionary uses the second and third bytes of the 3 byte compressed representation of a word as an offset into the proper table B for that dictionary to find the decompressed word or phrase within the dictionary located in table A for that particular dictionary selected.

Turning to FIG. 5, a schematic representation of the byte string of a compressed text is shown. The header is not indicated since it has been treated in detail in FIG. 6. In line A of FIG. 5, an escape bit pattern is the second byte shown and, although the use of an escape bit pattern can be avoided as indicated earlier, it is used in this example. The escape bit pattern is followed by the first character uncoded except for its usual EBCDIC or ASCII code since it represents a word that was not found in any dictionary. A number of intervening characters occur and then the last character of the word not found in any dictionary is encoded followed by a second escape bit pattern. Compressed words begin again in line B which is the continuation of line A in FIG. 5. A single byte compressed word comes first, followed by a 2 byte dictionary compressed word with its two fields of information representing the segment number for a given 2 byte dictionary and the relative position of the word within that dictionary. These are followed by yet another single byte compression word in this example, followed by a multiple space detection bit pattern and followed in line C with the number of multiple spaces that have been detected. This is followed by a segment number for a 3 byte dictionary compressed word, followed by 2 bytes that indicate the relative position of that word within the identified segment of a 3 byte dictionary.

Besides the escape bit pattern, other control patterns must be defined and loaded into the single byte compression control table. A version switch control pattern has been earlier described which, when encountered in the compressed text stream, it meant to indicate that the following byte indicates a new version number for the dictionary being used. It is encoded in the compression routine when the dictionary being used is to be overlain with another version of the same type of dictionary. A multiple consecutive occurrence of blank spaces in the text is another occurrence that requires, for best compression, a new control character which would be the multiple space control character when recognized. It would be followed by another byte indicating the number of blank spaces that are to occur. Given a 1 byte control character, it is obvious that 256 versions of the control can be indicated in a second following byte. Thus, for a dictionary version switch control character, the following byte can specify any one of 256 versions of the same dictionary. This may be used to enhance the number of words that can be represented in one byte by replacing single byte dictionaries with other versions, or it may be used to provide increased security of data transmission.

From the foregoing, it will be observed that numerous modifications in the number and type of dictionaries employed may be made while still using the same basic header construction scheme to identify to the receiver or using party which dictionaries and what size of those dictionaries have been employed in doing the compression. Similarly, the weighted frequency of use measure for establishing entries in the dictionaries has been shown to be an extremely efficient means of compressing text. The "text" itself may be alphanumeric data, audio data, graphical data or any other similar digital data character information which is to be condensed for storage or transmission. Therefore, while the invention has been described with reference to a preferred embodiment thereof, what is contained in the claims which follows is not intended by way of limitation but by way of description only.

What is claimed is:

1. A method of data compression, comprising steps of:
   separating an uncompressed, coded data stream into units;
   comparing said units against at least one user-selected dictionary of units having compressed code equivalents for each unit stored in association with the uncompressed encoded units; and
   outputting a header for compressed data comprising indications for defining the identity of each of said user-selected dictionaries used in compressing said data;
   outputting the compressed code equivalents for incoming units for which a true comparison is found in said comparing step and outputting the uncompressed encoded character stream for any said unit for which no true comparison is found; and
   arranging the entries in said dictionaries for said units in an order of merit which is the weighted frequency of use established by multiplying the average frequency of occurrence of each said unit in the language in which it is used by its length in characters and arranging the resulting products of said multiplying in decreasing order of magnitude.

2. A method as described in claim 1 wherein;
   at least one of said dictionaries comprises a control table of entries comprising segment identifiers for each segment of each said user selected dictionary used in compressing said data.

3. A data compression and decompression system, comprising:
   a transmitter and a receiver and means for connecting said transmitter to said receiver for the transmission and reception of compressed data;
   said transmitter including means for accepting an incoming uncompressed encoded data stream and for separating said stream into units;
   said transmitter also comprising means for comparing said units against at least one user selected compiled dictionary of units having compressed code equivalents for each unit stored in association with the uncompressed encoded units and further comprising;
   means for outputting a compressed data header comprising indications for defining the identity of each said user selected dictionary used in compressing said data; and
   means for outputting the compressed code equivalents for incoming units for which a true comparison is found in said comparing step and outputting the uncompressed encoded data stream for any said unit for which no true comparison is found;
   said receiver including means for receiving and analyzing said header for defining the identity of each of said user selected dictionaries used in compressing said compressed data stream and;
   means for separating said incoming compressed encoded data stream into units;
   means for comparing said units against at least one of said user selected and header identified compiled dictionary of units having compressed code equivalents for each unit stored in association with the uncompressed encoded units; and
   means for outputting uncompressed equivalents for incoming units for which a true comparison is found in said comparing step and for outputting said data stream for any said unit for which no true comparison is found.

* * * * *